United States Patent [19]

Marshall

[11] Patent Number: 4,633,505

[45] Date of Patent: Dec. 30, 1986

[54] CHARACTER COMPRESSION TECHNIQUE

[75] Inventor: Sidney W. Marshall, Webster, N.Y.

[73] Assignee: Xerox Corporation, Stamford, Conn.

[21] Appl. No.: 674,209

[22] Filed: Nov. 23, 1984

[51] Int. Cl.[4] .............................................. G06K 9/48
[52] U.S. Cl. ...................................................... 382/56
[58] Field of Search ................... 382/56; 358/260, 261, 358/262, 263; 340/748

[56] References Cited

U.S. PATENT DOCUMENTS

| | | | |
|---|---|---|---|
| 3,471,848 | 10/1969 | Manber | 340/748 |
| 3,686,631 | 8/1972 | Elliott | 382/56 |
| 3,833,900 | 8/1974 | Bahl et al. | 358/261 |
| 3,979,742 | 9/1976 | Kolb et al. | 340/748 |
| 4,443,794 | 4/1984 | Sakurai | 340/748 |
| 4,555,191 | 11/1985 | Gojo | 382/56 |

*Primary Examiner*—Stephen A. Kreitman
*Attorney, Agent, or Firm*—Ronald F. Chapuran

[57] ABSTRACT

The present invention is concerned with compression encoding and, in particular, the encoding of the second difference of the position of the boundary of a character on consecutive scanlines. Special code sequences represent the starting location for two new character boundaries relative to the last position in the scanline generated, the next two character boundaries that do not extend into the next scanline, and the end of a line when the preceeding scanline had no intersections with a character boundary. Also included are code sequences representing the first item on the last scanline of the character to terminate the code and at the right of all other boundaries on the current scanline.

8 Claims, 1 Drawing Figure

U.S. Patent   Dec. 30, 1986   4,633,505
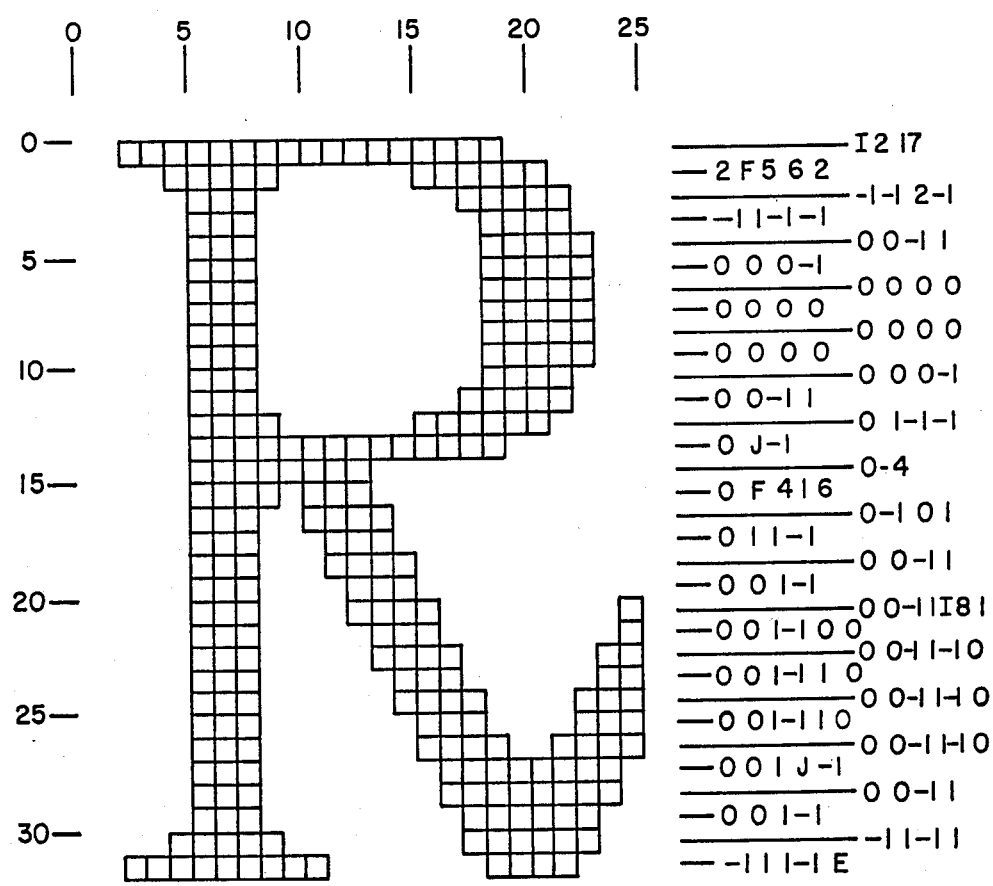

CHARACTER COMPRESSION TECHNIQUE

The present invention relates to a font encoding and, in particular, to a character compression technique.

It is a generally known technique to store, as a matrix of bits (a bit map), a pattern of light and dark areas representing a character to be printed in an electronic printing system. Storing the total pattern of light and dark areas works well when the printer resolution (spots per inch) is low, and/or the character point size small. However, since the number of bits required is proportional to the area of the character measured in spots, the storage required increases as the square of the point size. Also, more storage is required as the resolution increases. For example, a 72 point Times Roman font at 384 spots per inch requires over a quarter million 16 bit words to represent its bit map. At 600 spots per inch an 18 point Times Roman font requires over thirty thousand 16 bit words. It is possible to maintain such fonts on secondary storage devices, retrieving them only as required during printing, but the overhead of font retrieval then becomes a factor in the printing process. If fonts can be sufficiently compressed to allow the characters to be resident in main memory during printing, this inefficiency can be avoided. In any case, secondary storage transfer times can be reduced. Therefore, to design a printing system having the ability of printing large fonts or to improve print quality by providing higher resolution, more efficient methods of storing fonts are desired.

A number of data compression schemes are known for image facsimile transmission. There are differences, however, between facsimile transmission and font storage. These differences raise the question of the appropriateness and effectiveness of facsimile schemes for use with fonts. In particular, there is usually a greater percentage of white space on an entire page in facsimile than in a character with a minimal bounding box. The input to a facsimile transmission is generally unknown, whereas, the fonts to be encoded are available for analysis. Since each font needs to be encoded only once, it is acceptable to invest great effort in encoding provided that the decoding is efficient. Also, for font storage, there need be no concern about the effect of transmission error.

Two dimensional run length facsimile encoding schemes are well known. Information about the runs of black and white picture elements on a previous scanline are used to predict the runs on the current scanline. Since consecutive scanlines are usually similar, less information is required to specify the difference between the two scanlines than is needed to specify an entire scanline by itself. This approach reduces the amount of data which must be transmitted, but it also complicates the encoding. A correspondence between runs on a previous scanline and those on the current scanline must be established. For facsimile transmission, this information must be sent along with the difference information, and a single encoding scheme must handle both.

It is known, as disclosed in U.S. Pat. No. 3,471,848 to reproduce a character by defining the beginning and ending addresses of each segment of the character. The absolute addresses of the first scanline of the character are defined and then preferably the change of address at the beginning and end of the character for each subsequent scanline are described, in terms of a plus or minus increment from the previous address. The character can also be described by the beginning address of the segment and the length of the segment. U.S. Pat. No. 3,686,631 shows the use of a code that is compressed for representing characters by comparing full count codes of successive linear arrays of areas with a preceding scan and representing the differences in successive scans by the changed code. U.S. Pat. No. 3,833,900 shows a system having redundancy between segments compacted by means of a differential run length encoding. The differential distance between bit positions on successive lines are codes in accordance with a compaction code and code words having a small number of bits are used for small differentials.

A difficulty with the prior art systems of encoding is that there is still a relatively unfavorable compression ratio, that is the number of bits required to store the character image is relatively high. It has been discovered that it if the location points of the boundary of a character to be encoded are noted on three successive scanlines, then the second difference of the location of the points is generally very small and frequently zero. This second difference encoding provides a much more efficient encoding of the character.

Accordingly, it is an object of the present invention to provide a new and improved character compression technique. It is a further object of the present invention to provide an encoding technique that encodes a second difference for each intersection of a character boundary with a scanline. Further advantages of the present invention will become apparent as the following description proceeds, and the features characterizing the invention will be pointed out with particularity in the claims annexed to and forming a part of this specification.

Briefly, the present invention is concerned with compression encoding and, in particular, the encoding of the second difference of the position of the boundary of a character on consecutive scanlines. Special code sequences represent the starting location for two new character boundaries relative to the last position in the scanline generated, the next two character boundaries that do not extend into the next scanline, and the end of a line when the preceeding scanline had no intersections with a character boundary.

For a better understanding of the present invention reference may be had to the accompanying drawing wherein:

The FIGURE illustrates second difference encoding in accordance with the present invention.

If the location of a boundary of a character is noted on three consecutive scanlines to be $x_1$, $x_2$, and $x_3$ then the second difference $(x_2-x_1)-(x_3-x_2)$ is generally very small and frequently zero. The second difference encoding encodes this second difference for each intersection of a character boundary with a scanline. Special escape codes are needed for starting and terminating boundaries and other miscellaneous control functions.

The code can be described as follows:

Fxy—Fork—a new boundary starts to open out on the current scanline. X is the distance from the last intersection on the current scanline (or the start of the scanline if this is the first intersection) and y is the distance from the first (x) intersection to the second intersection. For the purpose of the second difference algorithm the first difference (to the nonexistant previous boundary point) is assumed to be zero. Note that I is used instead of F if a new boundary starts after the last boundary noted on the previous scanline.

Ixy—Insert—This is identical to a fork code and is used instead of a fork if a fork were to occur as the last item(s) on a scanline. This is to allow the decoder to determine where scanlines end.

J—Join—the next two character boundaries do not extend to the current scanline.

L—Line—this is used when successive scanline codes cannot be parsed without more information. This occurs when a scanline has no character boundaries on it.

E—End—This is the last code in a character description.

d—Double Difference—the corresponding boundary in the previous scanline has moved such that the second difference is d. (e.g., if d=0 then the boundary is straight although not necessarily vertical.)

The technique must take into account the state from one scanline to the next, in particular, the current location and slope of all boundaries that are currently active.

A desirable code can be constructed as follows:

| | |
|---|---|
| 00 | d = 0 |
| 01 | d = 1 |
| 10 | d = −1 |
| 1100iiii | d = iiii - 8(d in the range [−8 to +7] |
| 1101iiiiiiii | d = iiiiiiii - 128(d in the range [−128 to +127] |
| 111000 | Fork (x and y encoded as d above) |
| 111001 | Insert (x and y encoded as d above) |
| 111010 | Join |
| 11011 | End |
| 1111 | Line |

This code can be uniquely decoded as no code element is a prefix of any other code element.

The compression ratio can be increased still further by remembering a small additional state field from one scanline to the next. For example, a d=0 is followed by a d=0 50% of the time. By remembering the previous d=0 the following d=0 can be coded in a single bit. Other dependencies also exist which allow further shortening of the code. Allowing the coding to depend on recent history increases compression by another 25%.

With reference to the FIGURE, there is shown the letter R, a typical letter to be encoded. The letter R spans a matrix having 32 rows and 25 columns. As illustrated, each of the rows is a sequence of white spaces and squares representing black areas. For example, row 1 has a white spot in columns 1 and 2, black spots in columns 3 through 19 and white spots in columns 20 through 25. Assuming each of the rows is a scanline, the character is defined by black and white spots in the columns along each of the scanlines. Row 2 is comprised of white spots in columns 1 through 4, black spots in columns 5 through 9, white spots in columns 10 through 15, black spots in columns 16 through 21, and white spots in columns 22 through 25.

Along side the character, in accordance with the present invention, is the compressed code for the character R using the code symbols described above. In particular, with reference to the first line of the scan, it is noted that there is an initial white segment, a black segment followed by another white segment. The black segment extends from row 2 and line length 17. Thus, the code for this scanline is an I, meaning the next two numbers represent the starting locations for two new character boundaries, in particular, 2 and 17. The next scanline is represented by the code sequence 2F562. The 2 represents an increase of 2 from column 2 to column 4 for the beginning of the black segment in row 2 assuming that the previous difference was 0. The F and the 5 and 6 again represent incremental starting locations for new boundaries, in particular, the first black segment begins at row 4 and ends 5 rows after or row 9, the second white segment begins at row 9 and ends 6 rows later at row 15. The last 2 represents an increase in two rows for the end of the black boundary, assuming that the previous difference was 0, that is from row 19 to row 21.

As an illustration of the second difference in coding for one of the boundaries of the character R, the outermost or rightmost boundary of the upper portion of the letter R will be demonstrated with reference to rows 1 through 20 in Table 1. The first column of Table 1 lists rows 1 through 20. The second column lists the figure from the column for the rightmost black boundary. That is, with reference to the figure, the black segment in row 1 ends at column 19, the black segment in row 2 ends at column 21, the black segment in rows 3 and 4 ends at column 22 and the black segment for rows 5 through 10 ends at columns 23. The black segment ends at column 22 for rows 11 and 12, at column 21 for row 13, at column 19 for row 14 and for row 15 and 16 reaches the innermost location at column 13. The outer boundary then steps to column 14 for row 17 and 18 and to column 15 for rows 19 and 20.

The first difference between these boundaries is illustrated in column 3 of Table 1. In particular, the boundary in going from 19 to 21 is a +2, and going from a 21 to 22 is a +1, and from 22 to 22 is 0. The change from row 4 to 5 is 22 to 23 indicated by first difference of 1, and then there is no change from rows 6 through 10 indicated by a first difference of 0. The boundary goes from 23 to 22 in rows 10 to 11 indicated by a −1 difference. This pattern is followed to provide the first difference column in Table 1.

With respect to column 4, in Table 1, there is shown the second difference. In particular, the change from the first difference from row 2 to row 3 is −1, the change from a +1 in row 3 to 0 in row 4 is a −1, and a change from the 0 in row 4 to the 1 in row 5 is a +1. This pattern is followed to provide the second difference numerals as set forth in column 4. With reference to the code in the figure, the second difference pattern is the same pattern illustrated in rows 3 through 20 in the far righthand column of the code. It should be noted that for rows 1 and 2, since there is no real second difference, the first difference is assumed to be zero, row 1 of the code merely lists the end boundary 17 to be added to the 2 to give the row 19, consistent with this assumption and the row 2 lists a numeral 2 which also provides the end boundary upon adding 2 to the 19 of the previous row boundary.

It should be noted that there are a variety of coding schemes that could be used to encode second difference. This enclonding scheme primarily takes advantage of the fact that the second differences over consecutive scanlines are usually 0, 1, or −1, and these second difference values can be easily coded using two bits. An escape code can be used to allow for larger second difference values. Using this scheme to encode upper and lower boundaries of the black run, it is possible to pack as many as four scanlines into a 16 bit word.

While there has been illustrated and described what is at present considered to be a preferred embodiment of the present invention, it will be appreciated that numerous changes and modifications are likely to occur to those skilled in the art, and it is intended in the appended claims to cover all those changes and modifications which fall within the true spirit and scope of the present invention.

TABLE 1

| ROW | BOUNDARY | 1st DIFFERENCE | 2nd DIFFERENCE |
|---|---|---|---|
| 1 | 19 | assume 0 | |
| 2 | 21 | +2 | +2 |
| 3 | 22 | +1 | −1 |
| 4 | 22 | 0 | −1 |
| 5 | 23 | 1 | +1 |
| 6 | 23 | 1 | −1 |
| 7 | 23 | 0 | 0 |
| 8 | 23 | 0 | 0 |
| 9 | 23 | 0 | 0 |
| 10 | 23 | 0 | 0 |
| 11 | 22 | −1 | −1 |
| 12 | 22 | 0 | +1 |
| 13 | 21 | −1 | −1 |
| 14 | 19 | −2 | −1 |
| 15 | 13 | −6 | −4 |
| 16 | 13 | 0 | +6 |
| 17 | 14 | +1 | +1 |
| 18 | 14 | 0 | −1 |
| 19 | 15 | +1 | +1 |
| 20 | 15 | 0 | −1 |

I claim:

1. A method for compression encoding the digital representation of a character having a boundary, the encoding including escape codes, the character being recreated over a plurality of consecutive scanlines, the location of the boundary on three consecutive scanlines being $x_1$, $x_2$, and $x_3$, including the steps of
predetermining the second difference for each intersection of a character boundary with a scanline,
providing the second difference $(x_2-x_1)-(x_3-x_2)$ of the location of the boundary for relatively small second differences,
representing by an escape code the starting locations for the new character boundaries relative to the last position in the scanline generated, and
using an escape code to terminate the extension of character boundaries into the next scanline.

2. A method for compression encoding a digital representation of a character having a boundary including the steps of:
encoding the second difference of the positions of the boundary over consecutive scanlines, for second differences of small value, and
providing escape codes for second differences of relatively large value, one of the escape codes including the step of representing the digital locations for new character boundaries relative to the current scanline being generated.

3. The method of claim 2 wherein one of the escape codes includes the step of terminating the extension of character boundaries into the next scanline.

4. The method of claim 2, wherein one of the escape codes includes the step of inserting new boundaries into the next scanline.

5. A method for compression encoding the digital representation of a character having a boundary, the encoding including escape codes, the character being recreated over a plurality of consecutive scanlines, the location of the boundary on three consecutive scanlines being $x_1$, $x_2$, and $x_3$, including the steps of
predetermining the second difference for each intersection of a character boundary with a scanline,
providing the second difference $(x_2-x_1)-(x_3-x_2)$ of the location of the boundary for relatively small second differences,
using an escape code for starting and terminating boundaries of the character.

6. The method of claim 5 including the step of representing by an escape code the starting locations for the new character boundaries relative to the last position in the scanline generated.

7. The method of claim 5 including the step of using an escape code to terminate the extension of character boundaries into the next scanline.

8. The method of claim 5, including the step of inserting new boundaries into the next scanline.

* * * * *